United States Patent
Birman et al.

(10) Patent No.: US 7,461,200 B1
(45) Date of Patent: Dec. 2, 2008

(54) METHOD AND APPARATUS FOR OVERLAYING FLAT AND TREE BASED DATA SETS ONTO CONTENT ADDRESSABLE MEMORY (CAM) DEVICE

(75) Inventors: Mark Birman, Palo Alto, CA (US);
Ajay Srikrishna, Fremont, CA (US);
Srinivasan Venkatachary, Sunnyvale, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 432 days.

(21) Appl. No.: 10/950,323

(22) Filed: Sep. 23, 2004

(51) Int. Cl.
*G06F 12/00* (2006.01)
(52) U.S. Cl. .......................... 711/108; 707/6
(58) Field of Classification Search ................ 711/108; 365/49; 707/6
See application file for complete search history.

(56) References Cited

U.S. PATENT DOCUMENTS

| | | | |
|---|---|---|---|
| 5,014,195 A | 5/1991 | Farrell et al. | |
| 5,359,564 A | 10/1994 | Liu et al. | |
| 5,450,565 A | 9/1995 | Nadir et al. | |
| 6,137,707 A | 10/2000 | Srinivasan et al. | |
| 6,484,170 B2 | 11/2002 | Abdat | 707/6 |
| 6,697,803 B2 | 2/2004 | Abdat | 707/6 |
| 6,738,862 B1 | 5/2004 | Ross et al. | |
| 6,757,779 B1 | 6/2004 | Nataraj et al. | |
| 6,757,780 B2 | 6/2004 | Stark | |
| 6,954,823 B1 * | 10/2005 | James et al. | 711/108 |
| 6,958,925 B1 * | 10/2005 | Om et al. | 365/49 |
| 2001/0002476 A1 | 5/2001 | Abdat | 711/108 |
| 2003/0065879 A1 * | 4/2003 | Krishna et al. | 711/108 |
| 2004/0123024 A1 | 6/2004 | King | 711/108 |

OTHER PUBLICATIONS

U.S. Appl. No. 10/281,814, James et al.
U.S. Appl. No. 10/264,667, James et al.

* cited by examiner

*Primary Examiner*—Gary J Portka
*Assistant Examiner*—Yong J. Choe
(74) *Attorney, Agent, or Firm*—Haverstock & Owens, LLP

(57) ABSTRACT

A content addressable memory device (100) and method can have CAM blocks (102-0 to 102-29) organized in block sections (104-0 to 104-6). In an overlay mode of operation, an overlay engine (106) can access an algorithmic search (SPEAR) CAM (102-28 and 102-29) to generate overlay data set search keys (keyFIB<0> and <1>). Multiple data sets (e.g., FIB0, FIB1, ACL0) can be accommodated on the same CAM device by search key multiplexers (108-0 to 108-6) that selectively apply any of a number of data set search keys (keyACL<0>, keyFIB<0> and keyFIB<1>).

23 Claims, 15 Drawing Sheets

METHOD AND APPARATUS FOR OVERLAYING FLAT AND TREE BASED DATA SETS ONTO CONTENT ADDRESSABLE MEMORY (CAM) DEVICE

TECHNICAL FIELD

The present invention relates generally to content addressable memory (CAM) devices, and more particularly to a CAM device and method for storing multiple data sets which can be simultaneously searched.

BACKGROUND OF THE INVENTION

Network processing devices perform various functions in the processing of data packets, typically by executing a search operation on stored data values. As but two examples, a network processing device can search access control lists (ACLs) or forwarding information bases (FIBs). As is well known, an ACL include a set of rules (data set) that can limit access (e.g., forwarding of packets) to only those packets having fields falling within a particular range. A FIB can include data necessary for forwarding a packet, typically the generation of a "next hop" address in response to a destination address. While ACL searches typically involve a one-step search, in some cases FIB searches can be "algorithmic" requiring more than one search step to arrive at a search result. Thus, a one step ACL search can be considered a flat data set. In contrast, a FIB data set requiring an algorithmic search, can be considered a tree based data set, as a search may be conditional (may branch) depending upon a previous search result.

While types of integrated circuits can be used for executing a search operation on a data set, content addressable memory (CAM) devices enjoy wide application in network processing devices due to their rapid searching ability. Conventionally, in many applications, CAM devices are employed to search ACLs.

One example of a conventional CAM device is shown in FIG. 14 and designated by the general reference character 1400. A CAM device 1400 can include a number of CAM blocks (1402-0 to 1402-29). Such CAM blocks can be conceptualized as being arranged into block rows, each of which includes block half-rows (1404-0 to 1404-7). Thus, CAM blocks 1402-0 to 1402-3 and 1402-12 to 1402-15 can form a row, with CAM blocks 1402-0 to 1402-3 forming block half-row 1404-0, and CAM blocks 1402-12 to 1402-15 forming block half-row 1404-4.

In the example of FIG. 14, CAM blocks (1402-0 to 1402-29) can be utilized to store ACL data for searching based on search keys. In particular, CAM device 1400 can include control section 1406 that receives an external search key keyET. Control section 1406 can derive any of internal search key keyACL<0> to keyACL<3> from the external search key keyET. Any or all internal search keys keyACL<0> to keyACL<3> can be applied to each block half-row (1404-0 to 1404-7) in a search operation.

While CAM devices can be utilized to search FIBs, in practice for very large databases this is typically not the case. While conventional CAM devices can provide rapid searching capabilities for FIBs, such speed usually comes at a greater device cost, higher power consumption, and lower storage capacity. Because of this, many conventional solutions employ two different devices (e.g., integrated circuits or chips) to support the two different search types (FIB and ACL).

To better understand various aspects and advantages of the disclosed embodiments, two conventional examples for providing search capabilities on multiple data sets will now be described with reference to FIGS. 15A and 15B.

FIG. 15A is a block diagram of a first conventional network processing device. Network processing device 1500 can include a number of ternary CAM (TCAM) devices 1502-0 to 1502-2 formed on a circuit board, or the like. In the particular arrangement shown, a TCAM device 1502-0 can store ACL data sets (tables), while TCAM devices 1502-1 and 1502-2 can store FIB tables. Because TCAM device capacity is typically small relative to the size of FIB tables, multiple TCAM devices (1502-1 1502-2) are used to accommodate desired FIB data.

A drawback to the above conventional approach can be the number of devices (e.g., integrated circuits) needed, particularly if two or more TCAM devices are needed to accommodate large FIB tables. A larger number of devices typically results in higher costs and requires more circuit board space. In addition, such a multiple device solution can consume a relatively large amount of power.

FIG. 15B is a block diagram of a second conventional network processing device. Network processing device 1550 can include a ternary CAM (TCAM) device 1552 and a network search engine (NSE) 1554 formed on a circuit board, or the like. A TCAM device 1552 can store ACL data sets (tables). NSE 1554 can be a more specialized device having a larger storage capacity and/or that is more tailored for FIB type search operations. As but one example, an NSE 1554 can be a random access memory (RAM) based device, such as an SRAM based device, that executes FIB searches according to an internal algorithm.

As in the case of the example of FIG. 15A, a drawback to the above conventional approach can be the number of devices (e.g., integrated circuits) needed. While an NSE may reduce the number of chips utilized to form a network processing device, the approach still presents a multiple device solution.

Other conventional arrangements can include a more integrated version of the arrangement shown in FIG. 15B. That is, one or more TCAM devices can be integrated with one or more NSE in either a single integrated circuit, or in a multi-chip module (MCM).

A drawback to all such approaches can be lack of flexibility. In all cases, one device (or instantiation of such a device in single chip case) is dedicated to one type of database (ACL or FIB). This can limit flexibility in how data sets are stored.

In light of the above, it would be desirable to arrive at some way of providing a device capable of searching multiple data sets (e.g., ACLs and FIBs) that does not suffer from the drawback of the conventional cases noted above.

SUMMARY OF THE INVENTION

The present invention can include a content addressable memory (CAM) device that can include a plurality of regular CAM blocks, each having a plurality of CAM entries for comparing stored data values with internal search key values. The CAM device can also include at least one algorithmic search (Splitting Engine for All Routes, or "SPEAR") CAM block for storing data set values that generate match results corresponding to at least a first search data set in response to at least a portion of an external search key data value. In addition, a CAM device can include an overlay engine. In an overlay mode, an overlay engine can generate an overlay search key in response to a match result from a SPEAR CAM block. Such an overlay search key can be applied to regular (i.e., non-SPEAR) CAM blocks.

In such an arrangement, one CAM device can provide an algorithmic search option that initially searches a SPEAR CAM block to generate one type of search key (keyFIB), and then apply such value to another portion of a CAM device to generate an algorithmic search result.

According to one aspect of the embodiments, regular CAM blocks can store at least a portion of a forwarding information base (FIB).

In this way, a CAM device can accommodate algorithmic searches of a FIB.

According to one aspect of the embodiments, an overlay engine, in a non-overlay mode, can generate at least one non-overlay search key (keyACL) from an external search key value without accessing the SPEAR CAM. Such a non-overlay search key can be applied to regular CAM blocks that store values of a second data set different from the first data set.

In such an arrangement, one CAM device can provide both algorithmic and non-algorithmic search options. Thus, two different search types can be accommodated in a single CAM device. One search type first accesses a SPEAR CAM to generate a search key, and another search type generates search keys more directly from external search key data.

According to another aspect of the embodiments, regular CAM blocks can store at least a portion of an access control list (ACL).

In this way, a CAM device can accommodate searching both a FIB and an ACL in the same device. Such an arrangement can provide a compact solution to packet processing needs.

According to another aspect of the embodiments, a CAM device can include circuit block areas arranged in an array of N×M block areas. A SPEAR CAM block can occupy one or more of these circuit block areas. The majority of the remaining circuit block areas can contain regular CAM blocks.

In such an arrangement, a CAM device according to the invention can be formed with minimal modification of existing conventional CAM layouts that include an array of CAM block areas.

According to another aspect of the embodiments, the overlay engine can occupy one or more of the circuit block areas. Further, a circuit block area containing the SPEAR CAM block can be adjacent to a circuit block area containing the overlay control engine.

Such close proximity between a search control engine and a SPEAR CAM can minimize wiring needed to communicate between the two structures. This can allow for a compact CAM device with multiple search capabilities of the same general die (integrated circuit) size as a conventional CAM device.

According to another aspect of the embodiments, CAM blocks can be organized into block sections to which data set search key values are commonly applied. Further, a CAM device can include a mode multiplexer (MUX) corresponding to each block section. Each mode MUX can have inputs for receiving both an overlay search key (keyFIB) and non-overlay search key (keyACL). A MUX output can be coupled to the block section to provide one type of search key to the CAM block.

Such an arrangement can provide great flexibility in determining where different data sets are stored, as search key values can be selectively applied to each block section.

According to another aspect of the embodiments, overlay search keys and non-overlay search keys can be provided to the block sections by search key wiring. In addition, each mode MUX can be formed below the search key wiring.

Such an arrangement can allow for advantageously compact formation of multiplexer circuits. Thus, a CAM device according to the present invention can have only a minimal increase in area over a conventional CAM device.

According to another aspect of the embodiments, a CAM device can also include a configuration store having a plurality of configuration locations. Each configuration location can store a set of configuration bits. Each set of configuration bits can define search characteristics for the block sections. In addition, each configuration location can be selected by a portion of the external search key data.

Such an arrangement can provide a centralized data block that can be easily accessed or programmed to establish which block sections store which particular data sets. In one very particular case, search characteristics can indicate how portions of the external search key are applied to a block section, which data sets are searched in the block section, and which data sets can be searched simultaneously in the block section.

According to another aspect of the embodiments, each block section can provide compare results to one of a plurality of compare result buses.

In this way, results from different data search types can be provided from the same block section.

According to another aspect of the embodiments, an overlay engine can further include a SPEAR random access memory for receiving index values from the SPEAR CAM block and generating overlay search keys therefrom.

This arrangement can allow for rapid algorithmic searches in the CAM device.

According to another aspect of the embodiments, an overlay engine can further include an instruction decoder for decoding a portion of an external search key value to establish an overlay mode.

In this way, a CAM can be easily switched between overlay and non-overlay modes according to an instruction, or the like, applied with an external search key.

The present invention can also include a method for performing multiple data set search types on the same CAM device. The method can include providing a plurality of CAM entries arranged into entry groups for selectively storing data values for different data sets.

In an overlay mode, the method can include searching SPEAR entries of the CAM according to a portion of an external search key value to generate an overlay data set search key value. Non-SPEAR portions of the CAM can then be searched with the overlay data set search key.

In a non-overlay mode, the method can include generating non-overlay data set search keys from the external search key value without accessing SPEAR CAM entries. Non-SPEAR portions of the CAM can then be searched with the overlay data set search key.

According to one aspect of the embodiments, a method can include, in an overlay mode, generating non-overlay data set search keys from the external search key value without accessing the SPEAR portion of the CAM entries. The overlay mode can further include searching a first set of the CAM entries with the overlay data set search key and searching a second set of the CAM entries with the non-overlay data set search key, essentially simultaneously.

According to another aspect of the embodiments, data sets accessed by the method include one or more forwarding information bases and one or more access control lists.

According to another aspect of the embodiments, a method can include, in an overlay mode, multiplexing one of a plurality of data set search keys to a corresponding entry group.

The data set search keys can include overlay data set search key for application to a corresponding entry group.

According to another aspect of the embodiments, non-SPEAR CAM entries can be arranged into block sections. Further, the method can include a write operation that includes receiving a data set value. A data set value can be written to a block section according to configuration bits for the block section.

According to another aspect of the embodiments, block sections can have a priority with respect to one another. The data set values can include a first data set and a second data set, with the first data set value having a higher priority than the second data set value. Data set values of the first data set can be written to block sections of higher priority than block sections containing data values of the second data set.

In this way, priority can be established between data sets by writing values to particular block sections.

According to another aspect of the embodiments, non-SPEAR CAM entries can be arranged in CAM blocks, each comprising a plurality of CAM entries. These CAM blocks can be organized into block sections. The CAM blocks of each block section can commonly receive the overlay data set search key in the overlay mode and the non-overlay data set search key in the non-overlay mode.

According to another aspect of the embodiments, CAM blocks can include a plurality of regular CAM blocks and at least one redundant CAM block for replacing a defective regular CAM block. The method can also include, if a redundant CAM block is available, assigning such a redundant CAM block as at least a portion of the SPEAR portion of the CAM entries.

DETAILED DESCRIPTION

Various embodiments of the present invention will now be described in detail with reference to a number of drawings. The embodiments disclose content addressable memory (CAM) devices and methods capable of flexibly overlaying multiple search types on the same device. In one very particular example, a CAM device can store both access control lists (ACLs) and forwarding information bases (FIBs) and allow for simultaneous searches of both.

Figure 1:
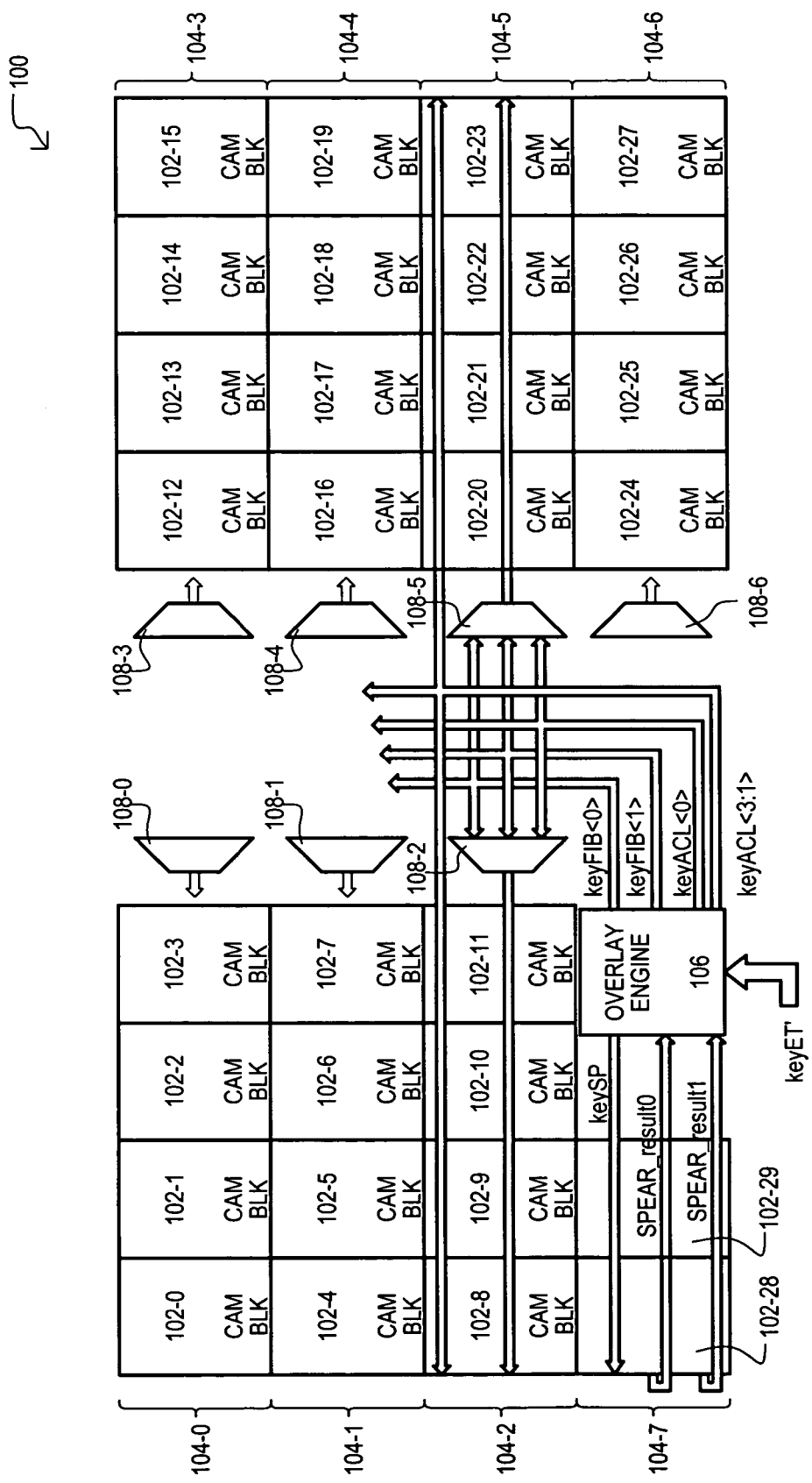
FIG. 1 is a block schematic diagram of a content addressable memory (CAM) device according to a first embodiment of the present invention.

A CAM device according to a first embodiment is set forth in block schematic diagram in FIG. 1, and designated by the general reference character 100. A CAM device 100 can include a number of CAM blocks 102-0 to 102-29. Each CAM block can include CAM entries for comparison with applied internal search key values. In the very particular embodiment of FIG. 1, each CAM block can receive four internal key values. However, unlike a conventional arrangement, a particular type of key value depends upon a mode of operation.

Unlike a conventional arrangement that provides a single search data type (e.g., only a FIB table data or ACL data), CAM blocks (102-0 to 102-29) in a first embodiment 100 can be logically divided into at least two portions to provide a "regular" CAM space and an algorithmic search (referred to hereinafter as Splitting Engine for All Routes, or "SPEAR") CAM space. A regular CAM space can provide CAM entries for storing multiple data sets (tables) for searching, where multiple (up to all) such data sets can be searched simultaneously. A SPEAR CAM space can have dual uses. In one (non-overlay) mode, the SPEAR CAM space acts as a regular CAM space, storing a same data set(s) as that of the regular CAM space. However, unlike conventional arrangements, in a second (overlay) mode, a SPEAR CAM space can store a data set that is searched to generate one or more search key values for the regular CAM space.

In the very particular example of FIG. 1, CAM blocks 102-0 to 102-27 can be considered regular CAM blocks that form a regular CAM space, while CAM blocks 102-28 and 102-29 can be considered SPEAR CAM blocks.

CAM blocks (102-0 to 102-29) can further be conceptualized as being arranged into "block sections" that commonly receive the same internal search key values. In the very particular example of FIG. 1, "block sections" can correspond to block half-rows. That is, like the conventional case of FIG. 14, CAM blocks (102-0 to 102-29) can be arranged into block rows, each of which includes two block sections (in this case, half-rows) (104-0 to 104-7). Thus, CAM blocks 102-0 to 102-3 can form block section 104-0, CAM blocks 102-4 to 102-7 can form block section 104-1, etc.

As shown in FIG. 1, a CAM device 100 may also include an overlay engine 106 and search key multiplexers (MUXs) 108-0 to 108-6, which correspond to block sections 104-0 to 104-6, respectively.

An overlay engine 106 can receive external search key data (keyET'), and in response, generate any of a number of search keys, including a SPEAR search key keySP, overlay search keys keyFIB<0> and <1>, and non-overlay search keys key-ACL<0> to <3>. Such values are understood to each be multi-bit values.

It is stressed that while this disclosure identifies search key values with the letters "FIB" and "ACL", such letters are not intended to imply any particular data type or data set (database).

In the example of FIG. 1, four key values can be applied to each block section (104-0 to 104-6). Particular signal lines carrying such values are shown for block sections 104-2 and 104-5, and not the other block sections, to avoid cluttering the view. Accordingly, blocks sections 104-0, 1, 3, 4 and 6 can receive internal key values with the same signal line arrangement as shown for block sections 104-2 and 104-5.

In operation, an overlay engine section 106 can receive external search key data keyET' which can include control information, such as an instruction and configuration data. From such data, an overlay engine section 106 can operate according to either an overlay (SPEAR) mode, or a non-overlay (non-SPEAR) mode. An instruction can indicate a type of search. A configuration selector can determine how search keys are applied to the various block sections (104-0 to 104-6).

In a SPEAR mode, multiple data sets can be accessed in parallel, including one data set requiring an algorithmic search. In this way, at least one type of search data set (algorithmic) can "overlay" another type of search data set (non-algorithmic). In one very particular example, one or more FIBs can overlay one or more ACLs.

In the example of FIG. 1, in a SPEAR mode, overlay engine section 106 can derive a SPEAR search key keySP from external search key data keyET'. The SPEAR search key keySP can be applied to a SPEAR CAM space (in this case, CAM blocks 102-28 and 102-29). In response to SPEAR search key, SPEAR CAM blocks 102-28 and 102-29 can return a search result value SPEAR_result0, SPEAR_result1, or both. In response to a search result value SPEAR_result0, overlay engine can 106 can generate internal key value keyFIB<0>. Similarly, in response to a search result value SPEAR_result1, overlay engine can 106 can generate internal key value keyFIB<1>.

Also in a SPEAR mode, according to the particular search type, search key multiplexers (MUXs) (108-0 to 108-6) can selectively apply internal key keyFIB<0> or key FIB<1>, or keyACL<0> to a corresponding block section (104-0 to 104-6). It is understood that search key MUXs (108-0 to 108-6) do not have to select between search keys in a uniform manner. That is, while one search key MUX may apply an internal keyFIB<0> to one block section, another could be applying any of the other received search key values (e.g., keyFIB<1> or keyACL<0>) to its respective block section. Such an arrangement allows for great flexibility to accommodate and search multiple data sets.

A SPEAR mode can also accommodate non-algorithmic searches. That is, in a SPEAR mode, an overlay engine section 106 can also generate any of non-SPEAR search keys (keyACL<0> to <3>) from external search key data keyET' (not by accessing a SPEAR CAM). In the very particular arrangement of FIG. 1, non-SPEAR search keys (keyACL<1> to key <3>) can have a "direct" application to a given block section, while non-SPEAR search keys keyACL<0> can be applied according to a search key MUXs (108-0 to 108-6).

In the example of FIG. 1, in a non-SPEAR mode, overlay engine section 106 can bypass the generation of a SPEAR search key keySP, and generate any of non-SPEAR search keys (keyACL<0> to key <3>) from external search key data keyET', and apply such values to appropriate block sections (104-0 to 104-7). Thus, in a preferred embodiment, non-SPEAR search keys can be applied to block section 104-7.

FIG. 1 can also represent how a CAM device 100 according to a first embodiment can provide an advantageously compact layout. In particular, FIG. 1 can be viewed to loosely represent a top plan view of circuit sections within a CAM device. When viewed as such, a CAM device 100 can be understood to be laid out essentially in an array with most positions occupied by a CAM block. More particularly, FIG. 1 can be understood to show two 4×4 arrays, that can be separated by a middle area that may be needed for the routing of internal key values (keyFIB<0> and <1>, keyACL<0> to <3>).

In such an arrangement, a right array can be conceptualized as including 4×4 circuit areas, each occupied by one CAM block (102-12 to 102-27). A left array can also be considered to include 4×4 circuit areas. The top twelve areas are each occupied by one CAM block (102-0 to 102-11). However, the bottom left two areas are occupied by SPEAR CAM blocks (102-28 to 102-29), while the bottom right two sections are occupied by all or a portion of overlay engine 106. It is understood that regular CAM blocks (102-0 and 102-27) can store part of a "flat" database for non-overlay searches. In contrast, SPEAR CAM blocks (102-28 and 102-29) can store part of a "tree" type database for overlay searches.

In such an arrangement, all circuit components can be arranged in a relatively compact fashion.

In addition, areas containing an overlay engine 106 can be advantageously adjacent to SPEAR CAM blocks (102-27 to 102-28), resulting in minimal signal routing for a SPEAR search key keySP and corresponding results (SPEAR_result0 and SPEAR_result1).

Figure 14:
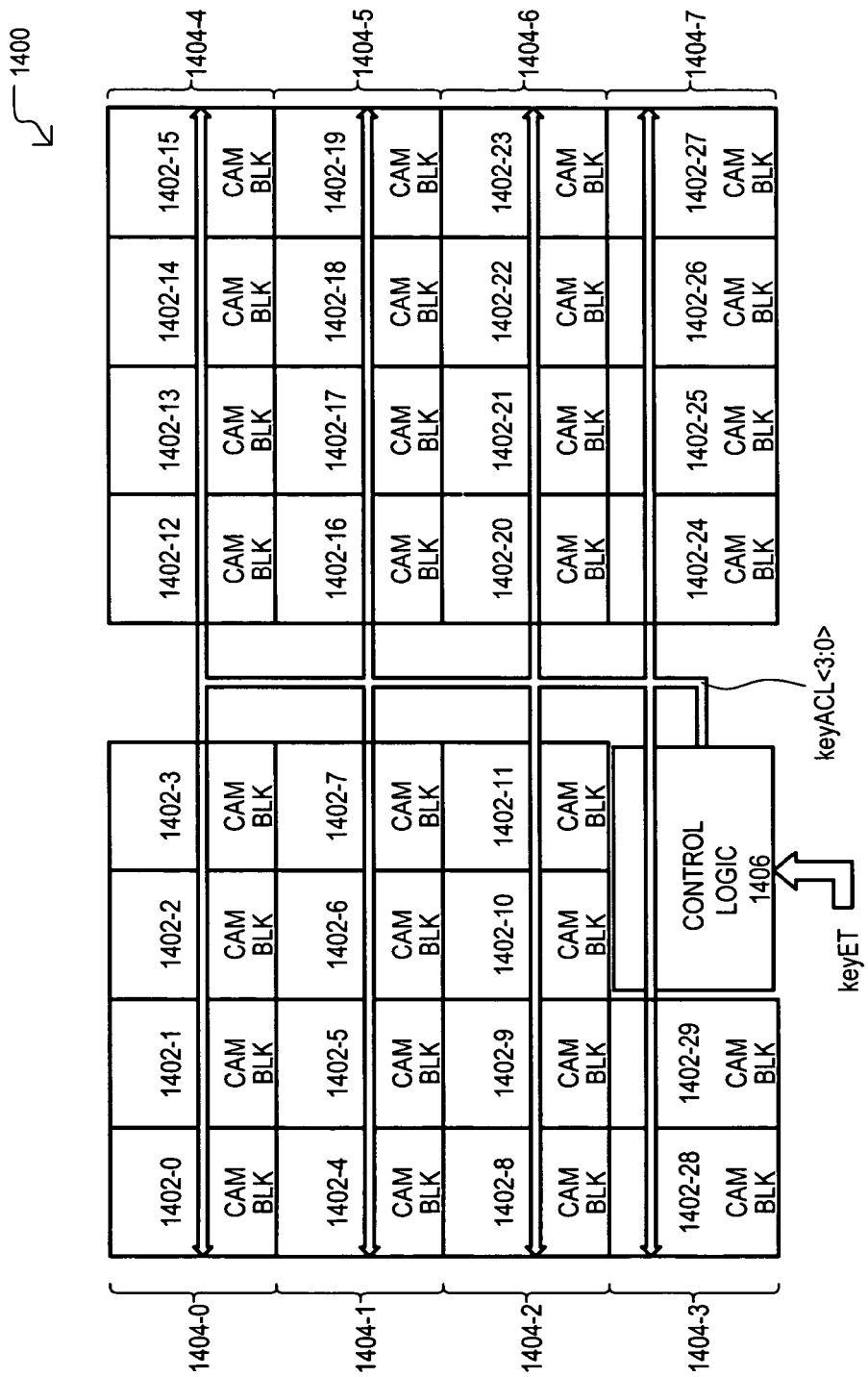
FIG. 14 is a block diagram of a conventional content addressable memory (CAM) device.
Figure 15A:
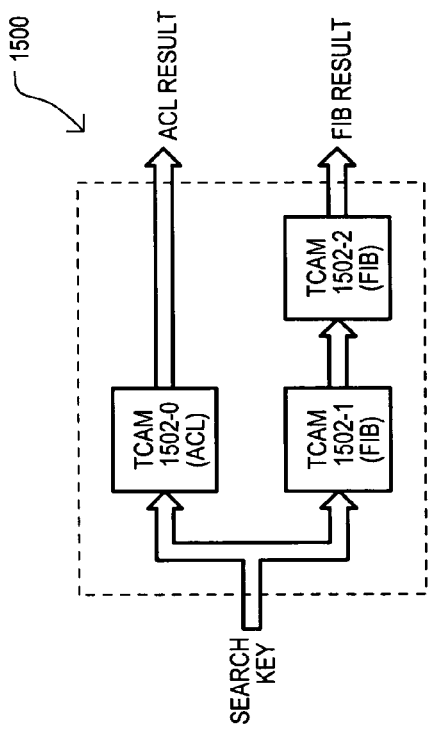
FIGS. 15A and 15B are block diagrams of conventional network processing devices.
Figure 15B:
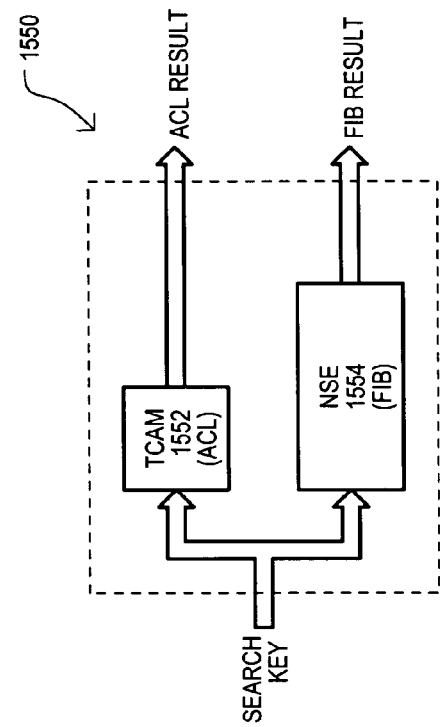

Still further, a comparison between FIG. 1 and FIG. 14 shows that a CAM device 100 according to a first embodiment can be formed to advantageously utilize existing structures of a conventional CAM device 1400. More particularly, a CAM device 100 can be formed using CAM blocks (102-0 to 102-29) having the same structure as conventional CAM device 1400. An overlay engine 106 can be formed the same location as control logic 1406. Further, SPEAR CAM blocks 102-28 and 102-29 can utilize existing wiring to carry a SPEAR search key keySP.

A CAM 100 according to a first embodiment can differ from a conventional CAM 1400 in that extra wiring can route six search keys rather than four. In addition, search key MUXs (108-0 and 108-6) can be formed between block sections. However, search key MUXs (108-0 and 108-6) can be formed below such wirings to thereby conserve area needed by such circuits. One particular example of such an arrangement will be shown in more detail below.

In this way, a CAM 100 that can flexibly overlay multiple types of search data sets can be formed by utilizing existing conventional structures.

Figure 2:
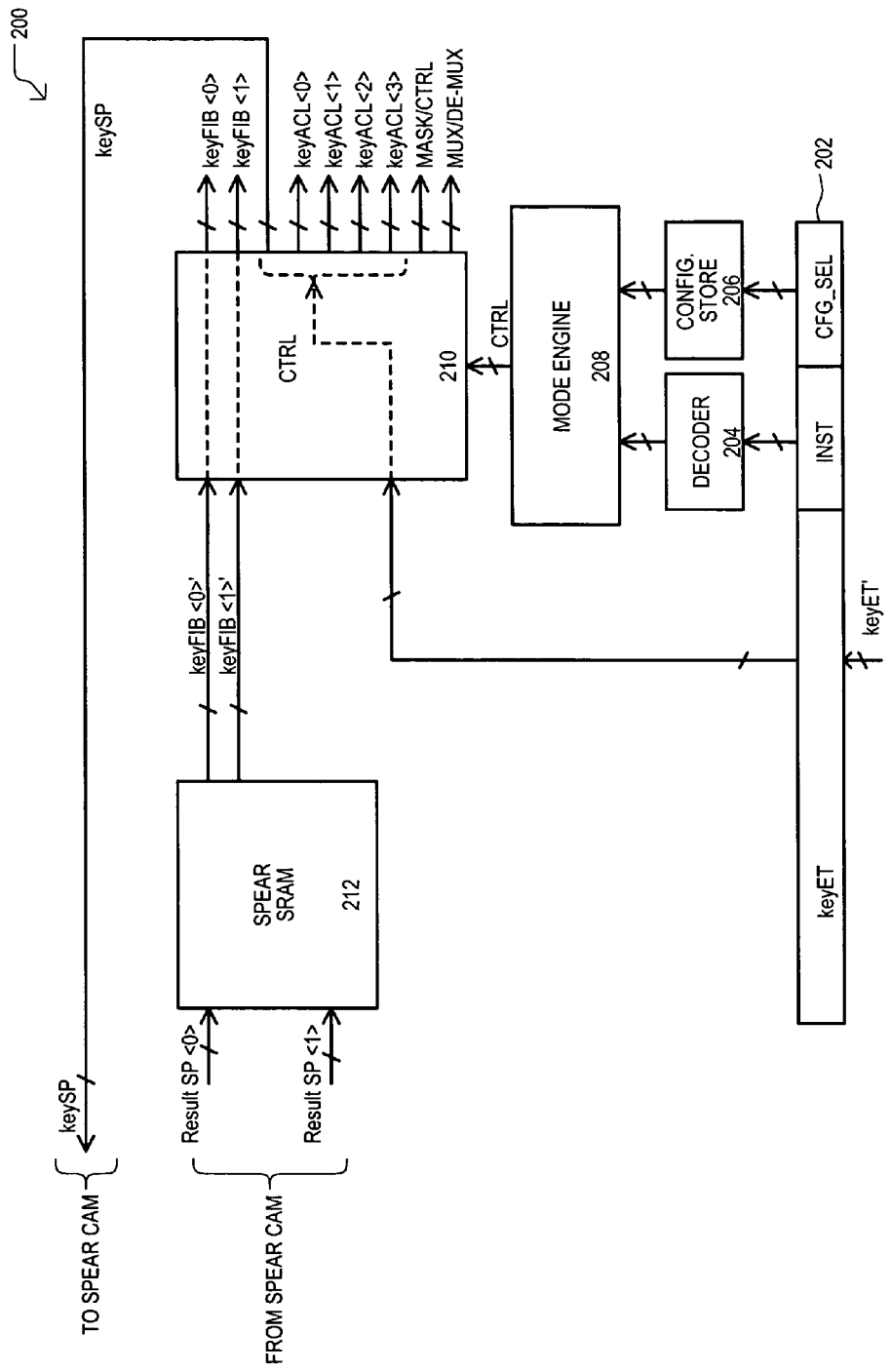
FIG. 2 is a block schematic diagram of an overlay section according to one embodiment of the present invention.

Referring now to FIG. 2, one very particular example of an overlay engine section is set forth in a block schematic diagram and designated by the general reference character 200. An overlay engine section 200 may used as overlay engine 106 in a CAM device 100.

An overlay section 200 can include an external key data store 202, an instruction decoder 204, a configuration store 206, a mode engine 208, a control circuit 210, and a SPEAR random access memory (RAM) 212. An external key data store 202 can store a received external key data value keyET'. In the particular example of FIG. 2, such a value can include an external key keyET, an instruction INST, and a configuration select value CFG_SEL. An external key keyET can be forwarded to control circuit 210 for parsing according to a particular operation being performed. An instruction INST can be decoded by decoder 204 and forwarded to mode engine 208. A configuration select value CFG_SEL can be applied to a configuration store 206 to generate configuration bits for mode engine 208.

Configuration bits can contain information related to search operations, including but not limited to any of the following: how an external search key keyET can be manipulated (e.g., parsed, masked), what kind of searches to perform simultaneously, and/or the CAM block sections on which each kind of search can be performed.

A mode engine 208 can receive a decoded instruction and mode bits, and in response thereto, generate control signals for control circuit 210. Such control signals can vary according to mode. In a non-SPEAR mode, in response to control signals from mode engine 208 a control circuit 210 can parse an external key keyET into one or more non-SPEAR key values keyACL<0> to <3>. Further, a search key keySP can also be a non-SPEAR type search key applied to a SPEAR CAM portion (not shown). In addition, a control circuit 210 can generate mask data signals MASK/CTRL as well as MUX control signals MUX/de-MUX. Mask data signals can control global masking operations that can selectively mask internal search key values, or portions thereof, as they are applied to a block section. MUX control signals MUX/de-MUX can control the operation of search key MUXs (such as 108-0 and 108-6 of FIG. 1), as well as result bus de-multiplexers (de-MUXs), examples of which will be described in more detail below.

In a SPEAR mode, in response to control signals from mode engine 208 a control circuit 210 can parse an external key keyET to generate a SPEAR search key keySP for use on a tree type database. Such a search key can be applied to a SPEAR CAM portion (not shown). Unlike the non-SPEAR operation, a SPEAR CAM portion can then return result values ResultSP<0> and/or ResultSP<1>. Such values are applied to a SPEAR RAM 212. As but one example, such values can form all or part of a RAM address. A SPEAR RAM 212 is preferably a static RAM. In response to result values (ResultSP<0> and/or ResultSP<1>), a SPEAR RAM 212 can output preliminary SPEAR search keys keyFIB<0>' and key-FIB<1>' to control circuit 210.

In a SPEAR mode, mode engine 208 and control circuit 210 can also function in the same general fashion as a non-SPEAR mode to generate any of non-SPEAR keys key-ACL<0> to keyACL<3>, mask data signals MASK, and MUX control signals MUX/de-MUX, as described above.

Thus, a mode engine 208 can select a mode of operation (e.g., SPEAR or non-SPEAR) based on configuration bits provided by decoder 204 and/or configuration store 206.

In this way, an overlay engine section 200 can generate key values in SPEAR mode according to different search types. One search type can be algorithmic, accessing a SPEAR CAM and then a SPEAR RAM to generate one or more internal search key values. Another search type can be non-algorithmic, generating one or more internal search keys in a more direct fashion from an external search key value.

Figure 3:
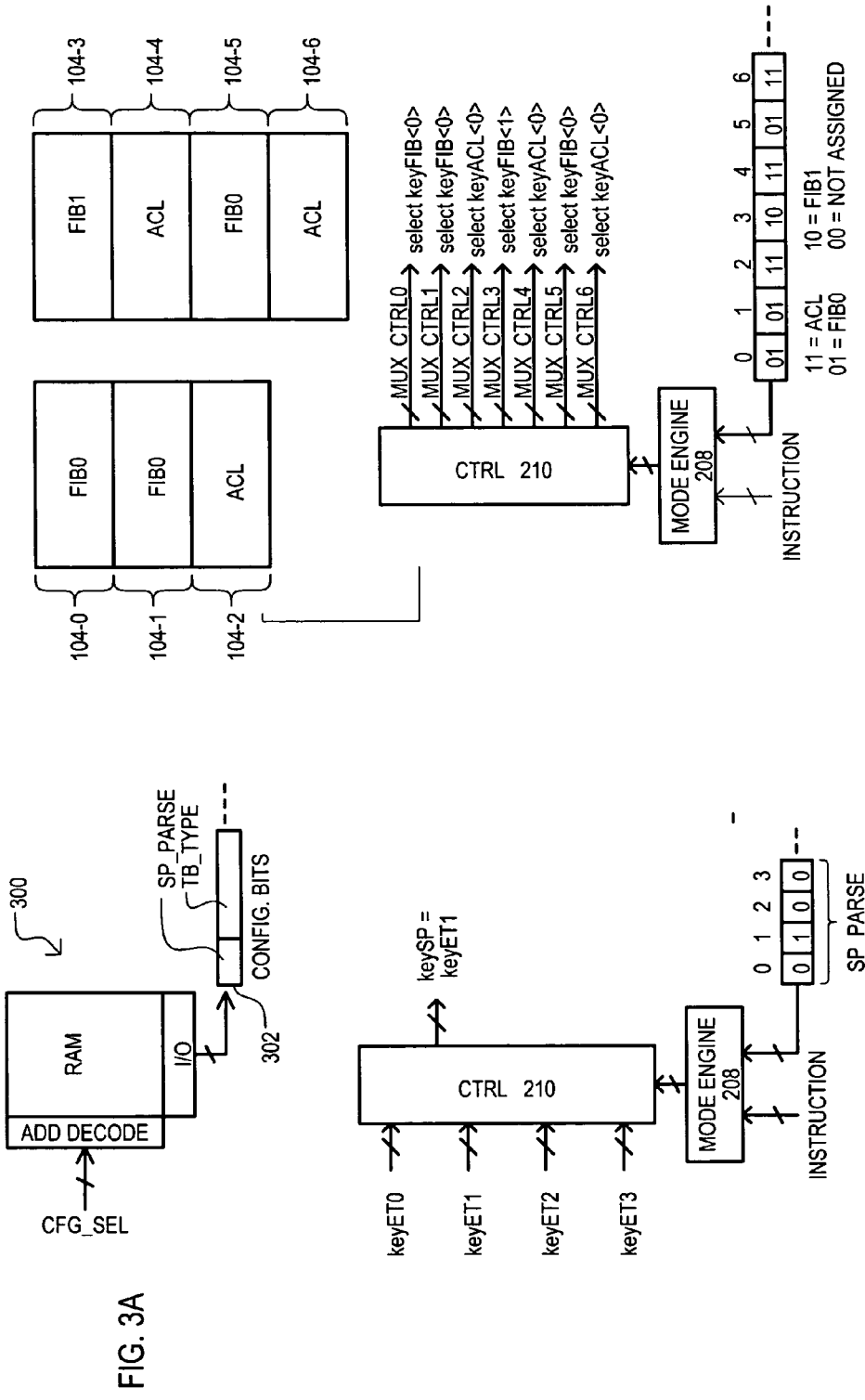
FIG. 3A is a block schematic diagram of a configuration store according to one embodiment.
FIGS. 3B and 3C show examples of configuration bit values and corresponding operational effects.

Referring now to FIGS. 3A to 3C, one very particular example of a configuration store and examples of configuration bits are set forth in a series of block diagrams. Such a configuration store can be utilized as configuration store 206 in FIG. 2.

Referring now to FIG. 3A, a configuration store 300 according to one embodiment can be a memory circuit (e.g., a RAM) that receives a configuration select value CFG_SEL as an address value that selects a set of configuration bits 302. Of course, FIG. 3A represents but one example of a configuration store and should not be construed as limiting the invention thereto. A configuration store may also be formed by register circuits, or the like. Further, while a nonvolatile configuration store may provide advantageous flexibility, such a store may also be formed via fuse option and/or mask option.

Referring still to FIG. 3A, configuration bits 302 provided by a configuration store 300 can contain a number of fields that can dictate operational aspects of a search. The particular example of FIG. 3A shows two fields, a SPEAR parse field SP_PARSE, and a table type field TB_TYPE.

FIG. 3B is block diagram illustrating how a field SP_PARSE can affect a search operation according to one very particular example. The figure shows circuit sections previously described with reference to FIG. 2.

In FIG. 3B, an external key keyET can be logically divided into a number of portions, in this case four: keyET0, keyET1, keyET2 and keyET3. A SP_PARSE field can include a bit location corresponding to each such portion. As shown in the figure, according to such configuration bits, a mode engine 208 can direct control circuit 210 to select the portion of the external key corresponding to a "1" in the SP_PARSE field. Thus, in the example shown, control circuit 210 selects portion keyET1 as a SPEAR search key keySP.

Of course, FIG. 3B is but one example. An external search key could be parsed into a larger or smaller number of portions, multiple portions can be used to generate a SPEAR search key, and more complex operations can be dictated by configuration bits (e.g., logical operation on one or more external key portions). In such a case, a SP_PARSE field would include a correspondingly larger number of bits.

FIG. 3C is block diagram illustrating how a field TB_TYPE can affect a search operation according to one very particular example. The figure shows circuit sections previously described with reference to FIGS. 1 and 2.

FIG. 3C shows a number of block sections (104-0 to 104-6). Each such block section can include a portion for storing a particular data set. A search key applied to such portions is determined according to associated MUX control signals. Such MUX control signals can form part of MUX/de-MUX signals of FIG. 2. In FIG. 3C, three data sets are shown, FIB0, FIB1 and ACL. Data sets FIB0 and FIB1 can represent tables corresponding to an algorithmic search operation, and in one very particular example can correspond to two different forwarding information bases. Data set ACL0 can represent a table corresponding to a non-algorithmic search operation. In one particular example, data sets FIB0 and FIB1 can be different forward information bases, while data set ACL0 can represent one ACL.

In the very particular example of FIG. 3C, a TB_TYPE field can include two bits corresponding to each block section (104-0 to 104-6), as shown in the figure. Each two bits can designate a particular data set type (i.e., ACL0, FIB0 or FIB1). Thus, the representation of block sections (104-0 to 104-6) include portions illustrating how data sets can be stored in a CAM in an overlay (SPEAR) mode of operation.

As also shown in FIG. 3C, according to configuration bits of a TB_TYPE field, a mode engine 208 can direct control circuit 210 to generate an appropriate set of MUX control signals. FIG. 3C shows the generation of MUX control signals MUX_CTRL0 to MUX_CTRL6 that can be generated in a SPEAR mode to access all available data sets. More particularly, each MUX control signal will have a value for MUXing the appropriate internal search key according to which data set is stored in the corresponding block section.

In this way, configuration bit values can control generation and application of search key values to enable simultaneous searches of different types and/or different data sets.

Figure 4:
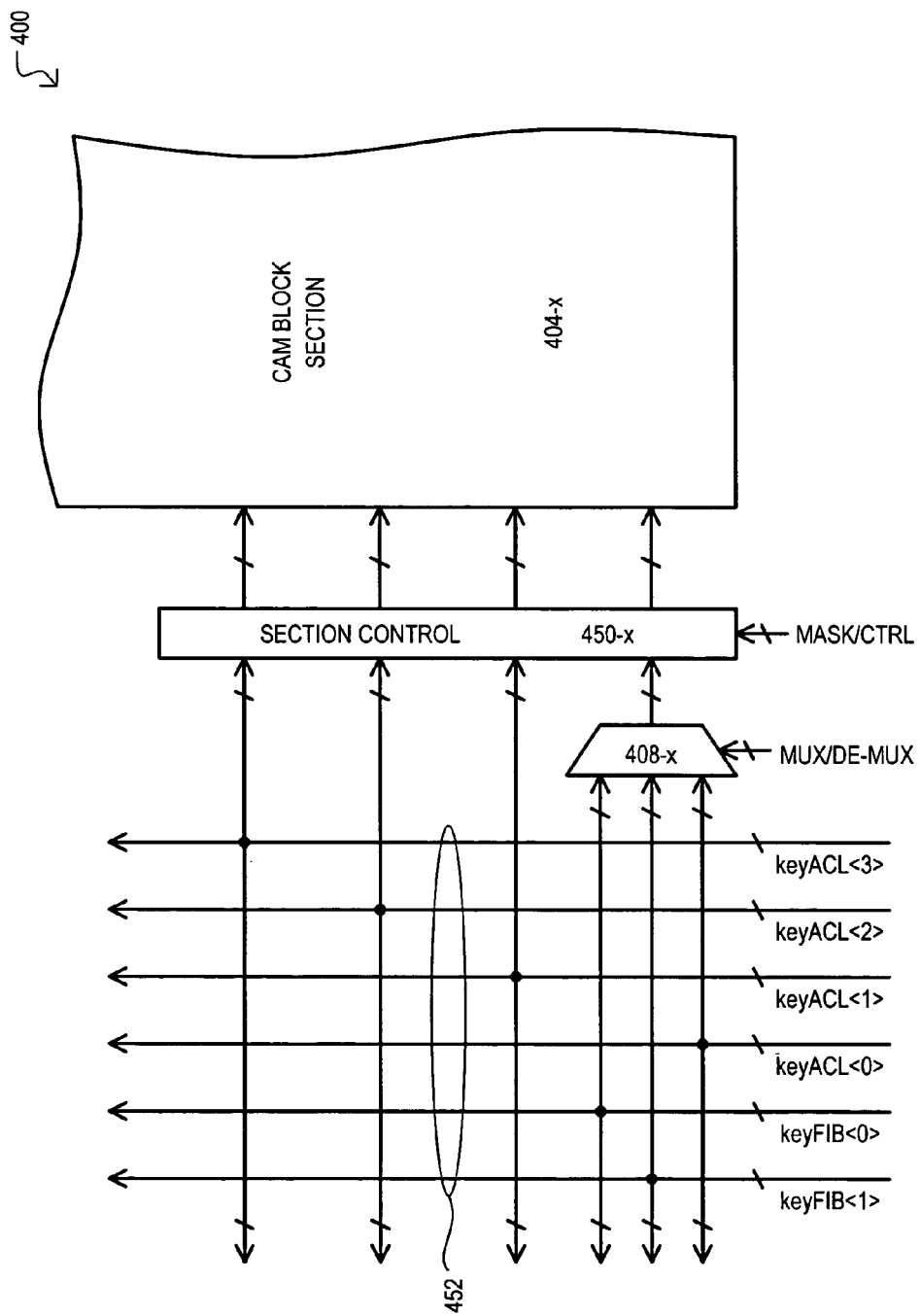
FIG. 4 is a schematic diagram showing data processing logic for a block section according to one embodiment.

Referring now to FIG. 4, data processing logic for a block section (e.g., block half row) is set forth in a block schematic diagram and designated by the general reference character 400. Data processing logic 400 can be repeated for each block section.

In the particular example of FIG. 4, data processing logic 400 can include a search key MUX 408-$x$ and a section control circuit 450-$x$. Internal search key values (keyFIB<0> and <1>, keyACL<0> to <3>) can be received from an overlay engine on a main search key bus 452. Selected internal search keys can be applied to section control circuit 450-$x$ essentially directly, while others can be multiplexed. In FIG. 4, internal search keys keyACL<1> to <3> can be applied essentially directly, while internal search keys keyFIB<0>. keyFIB<1>, keyACL<0> can be multiplexed to section control circuit 450-$x$ according to MUX/de-MUX signals.

Search control section 450-$x$ can apply search key data to block section 404-$x$. Such search key data can be masked or otherwise manipulated according to mask signals MASK/CTRL.

Figure 5:
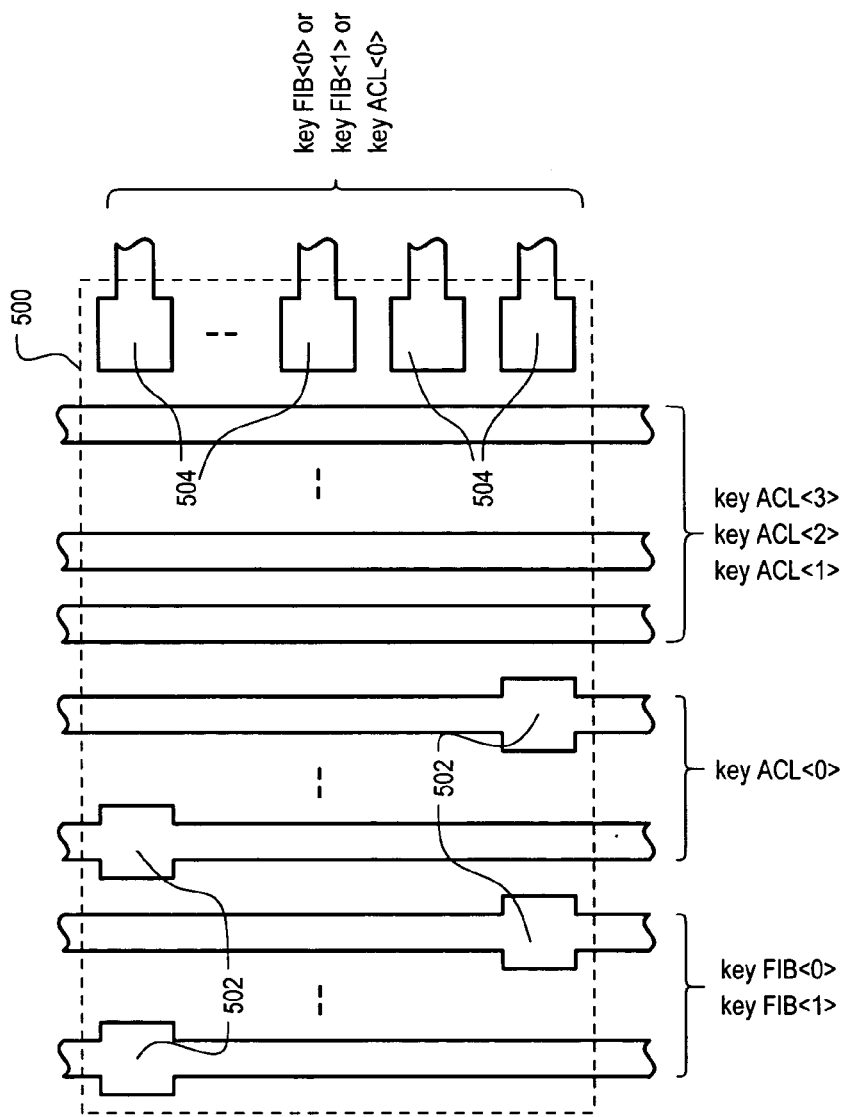
FIG. 5 is a top plan view showing the placement of search key multiplexer according to one embodiment.

As noted previously, to preserve a compact circuit arrangement, search key MUXs can be formed below existing wiring routes. One example of such an arrangement is shown in FIG. 5. FIG. 5 is a top plan view showing a general layout of a search key MUX 500 and overlying signal lines for various internal search key values, including keyFIB<0> and <1>, and keyACL<0> to <3>. A search key MUX 500 can have active circuit elements (e.g., transistors) formed below the signals lines, with such signal lines providing selected search key values via input contact/vias 502. Input contacts can connect to substrate circuit elements either directly (contact) or by way of intervening conductive layers (vias). A search key MUX 500 can also include output contact/vias 504 that provide a selected internal search key to a block section. In this example, an output search key can be selected from keyFIB<0>, keyFIB<1> and keyACL<0>.

In this way, search key MUXs can be placed beneath existing wiring to provide the above-described overlay capability without large increases in area overhead.

The selective application of internal search keys, as described above, can generate different compare results depending upon the type of search executed. Accordingly, a CAM device according to the present invention can include one or more result buses to capture search result values.

Figure 6:
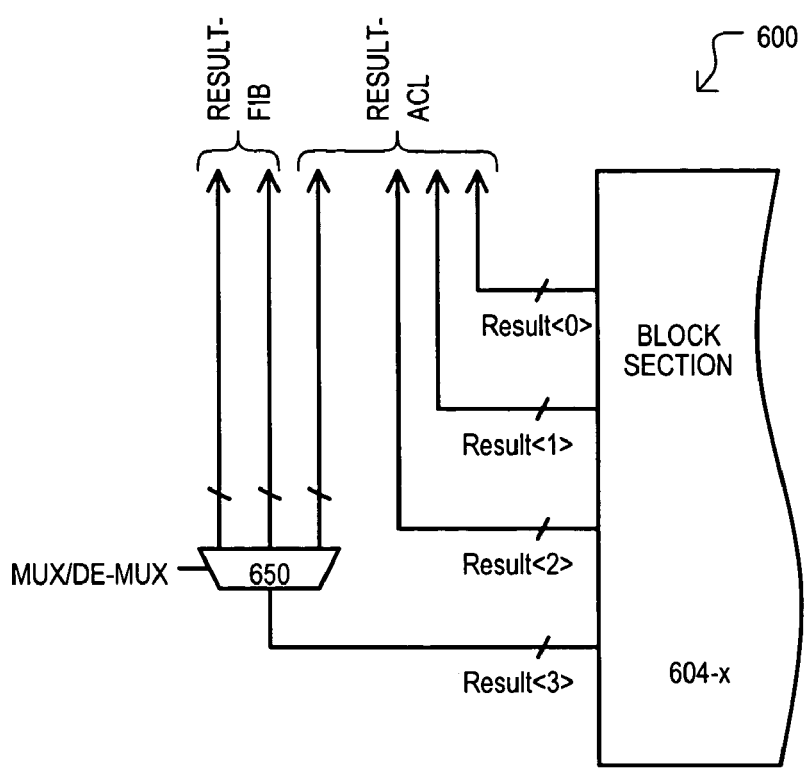
FIG. 6 is a schematic diagram showing a multiple result bus arrangement according to one embodiment.

A result bus arrangement according to one embodiment is set forth in FIG. 6, and designated by the general reference character 600. In the arrangement shown, a block section 604-$x$ can provides results on four result buses Result<0> to Result<3>. In a SPEAR mode, a result bus Result<0> can carry FIB search result data, but in a non-SPEAR mode can carry ACL search result data.

In the arrangement of FIG. 6, search result data output on result bus Result<3> can be de-multiplexed onto one of two FIB buses or an ACL bus.

Of course, alternate arrangements can distinguish result data values from different search types and/or search data sets. Thus, the arrangement of FIG. 6 should not necessarily be construed as limiting the invention to any particular circuit structure.

While the embodiment of FIG. 1 can provide an advantageously compact CAM device that can take advantage of (re-use) existing circuit structures of a basic conventional CAM device, other embodiments can include a different arrangement of circuit structures.

Figure 7:
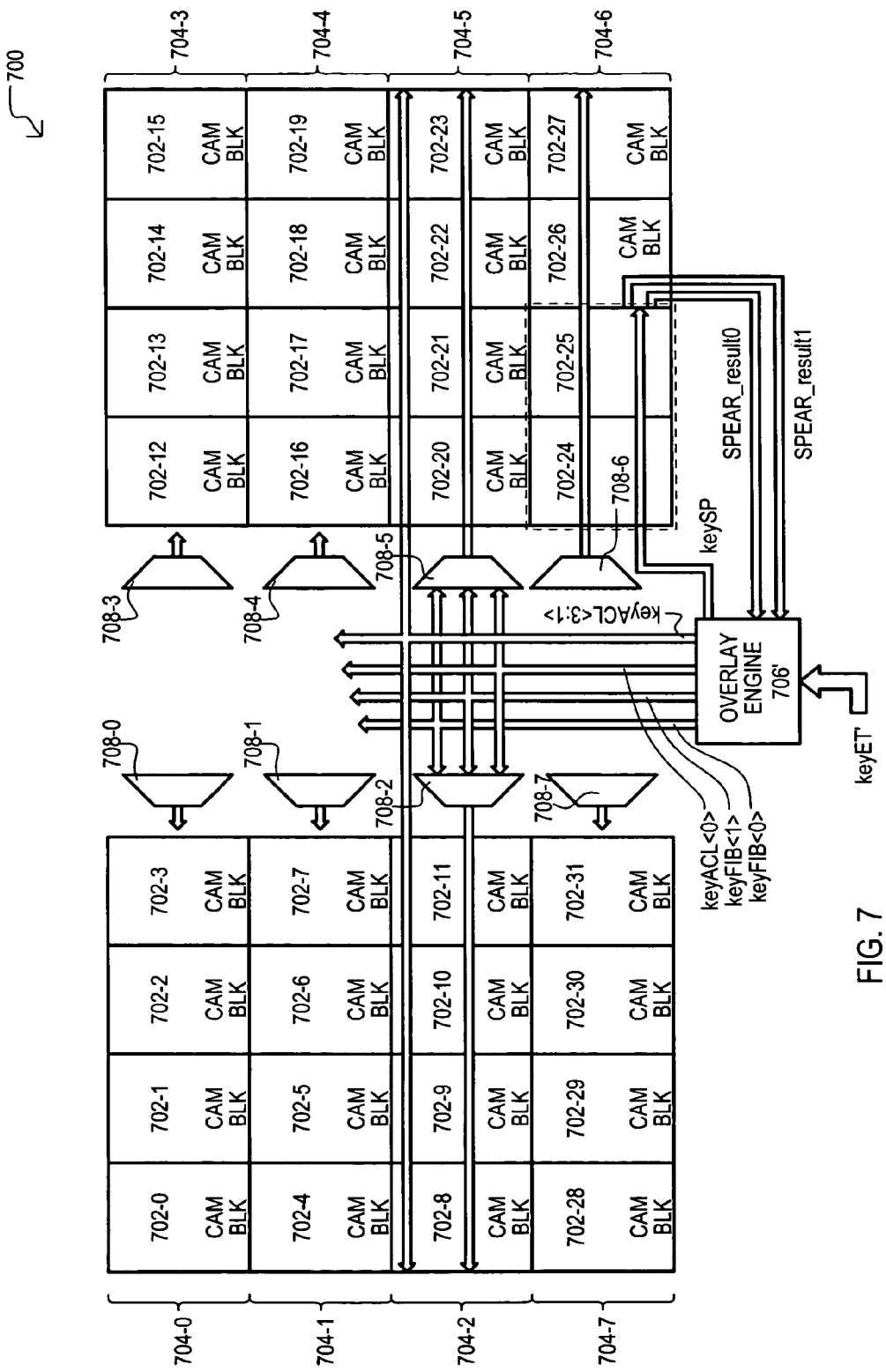
FIG. 7 is a block schematic diagram of a CAM device according to a first alternate embodiment of the present invention.

A CAM device according to a first alternate embodiment is set forth in FIG. 7, and designated by the general reference character 700. A CAM device 700 can include some of the same circuit components as the embodiment of FIG. 1. Accordingly, like components will be referred to by the same reference character, but with the first digit being a "7" instead of a "1".

The alternate embodiment 700 can differ from that of FIG. 1 in that an overlay engine 706' can be placed separate from the array-like arrangement of CAM blocks. Consequently, a CAM device can further include CAM blocks 702-30 and 702-31, which can serve as regular CAM blocks. The alternate embodiment 700 can further differ in that CAM blocks 702-24 and 702-25 can serve as a SPEAR CAM. In such an arrangement, internal search keys can be applied to CAM blocks 702-26 and 702-27.

The first alternate embodiment CAM device 700 may need additional wiring over the embodiment of FIG. 1 in order to apply a search key keySP and receive SPEAR search results SPEAR_result0 and/or SPEAR_result1. Otherwise, the alternate embodiment 700 can operate in the same general fashion as the embodiment of FIG. 1.

In this way, a CAM device can include an overlay engine formed apart from the circuit area array containing associated CAM blocks.

Figure 8:
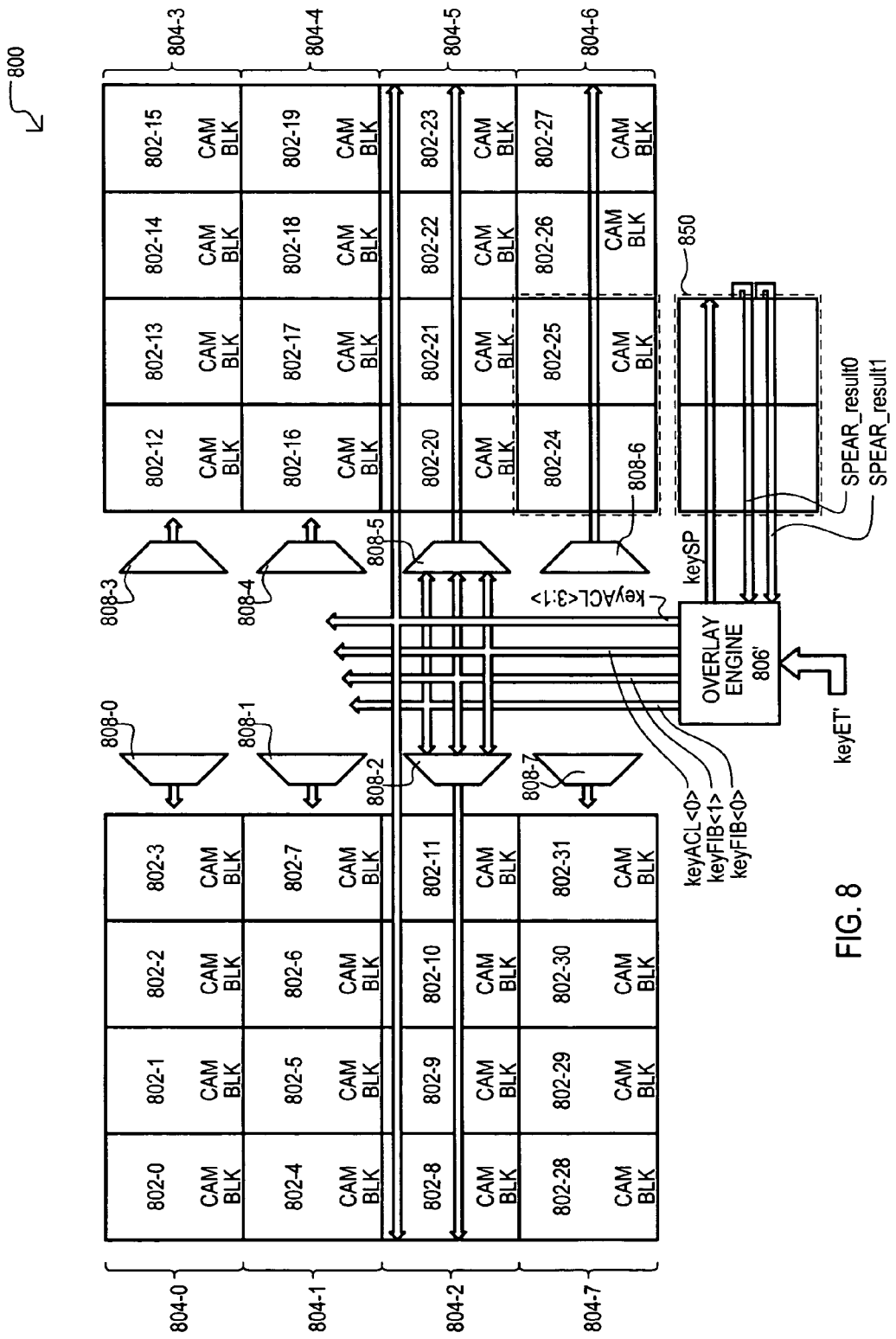
FIG. 8 is a block schematic diagram of a CAM device according to a second alternate embodiment of the present invention.

A CAM device according to a second alternate embodiment is set forth in FIG. 8, and designated by the general reference character 800. A CAM device 800 can include some of the same circuit components as the alternate embodiment of FIG. 7. Accordingly, like components will be referred to by the same reference character, but with the first digit being an "8" instead of a "7".

The second alternate embodiment 800 can differ from that of FIG. 7 in that a SPEAR CAM portion can be separately formed, and thus exist apart from an array of "regular" CAM blocks. Consequently, internal search keys keyFIB<0> and <1>, and keyACL<0> to <3> can be selectively applied to all CAM blocks 802-0 and 802-31, if desired. In addition, a SPEAR CAM block 850 is shown as an individual structure, and not as part of any block section (804-0 to 804-7).

The second alternate embodiment CAM device 800 may need additional area to accommodate a SPEAR CAM block, and dedicated wiring for applying a SPEAR search key keySP and for receiving a search result SPEAR_result0 and SPEAR_result1. Otherwise, the second alternate embodiment 800 can operate in the same general fashion as the embodiment of FIG. 1.

In this way, a CAM device can include both an overlay engine and a SPEAR CAM formed apart from a circuit area array containing associated CAM blocks.

Figure 9:
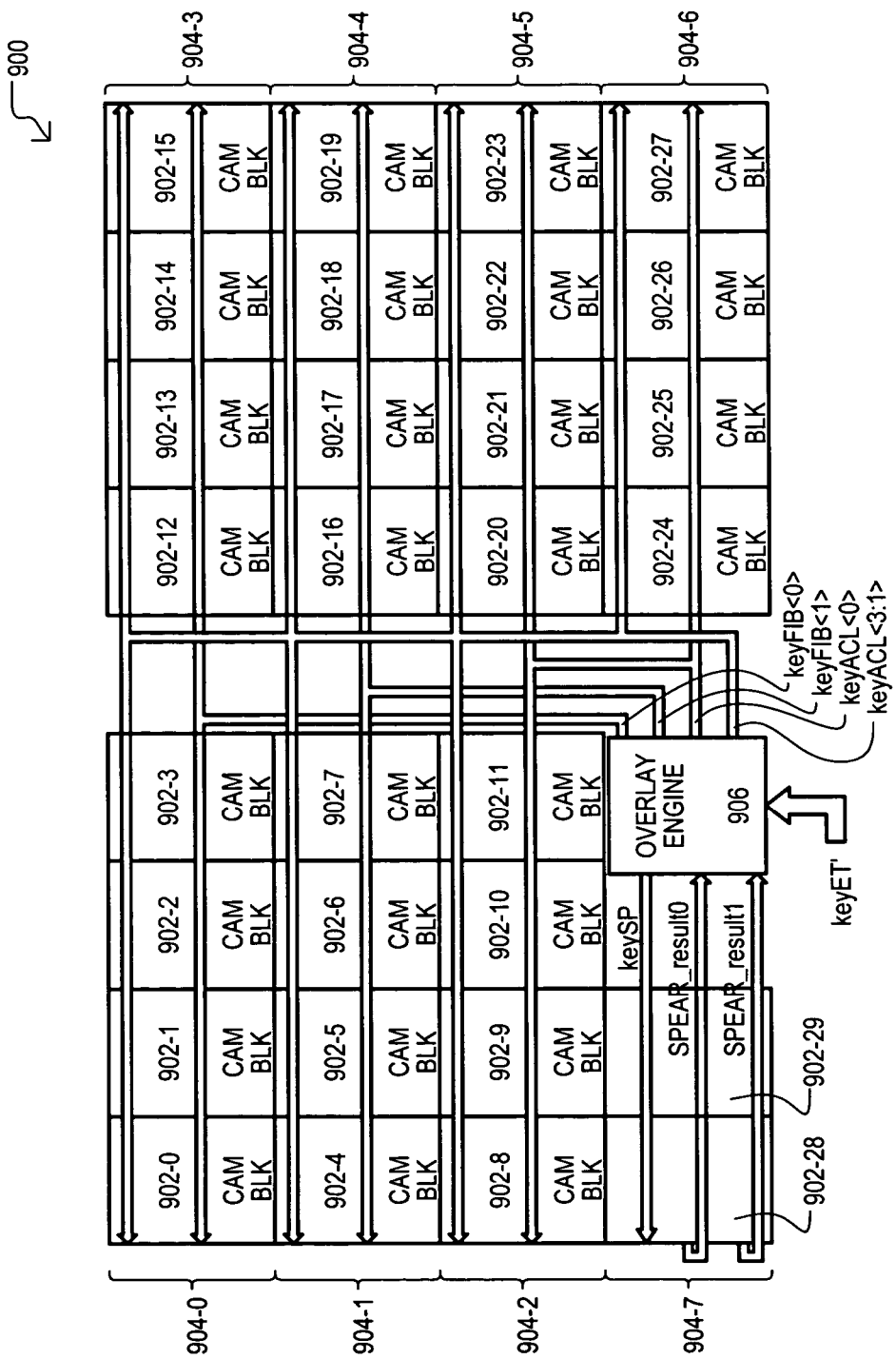
FIG. 9 is a block schematic diagram of a CAM device according to a third alternate embodiment of the present invention.

A CAM device according to a third alternate embodiment is set forth in FIG. 9, and designated by the general reference character 900. A CAM device 900 can include some of the same circuit components as the embodiment of FIG. 1. Accordingly, like components will be referred to by the same reference character, but with the first digit being a "9" instead of a "1".

The third alternate embodiment 900 can differ from that of FIG. 1 in that each block section (e.g., block half-row) 904-0 to 904-6 can be dedicated to a particular selectable data set. In the very particular example of FIG. 9, block sections 904-0 and 904-3 are dedicated to a SPEAR data set FIB0, and so receive an internal search key keyFIB<0>. Block sections 904-1 and 904-4 are dedicated to a SPEAR data set FIB1, and so receive an internal search key keyFIB<1>. Finally, block sections 904-2, 904-5 and 904-6 are dedicated to a data set ACL, and so receive an internal search key keyACL<0>.

Of course, the assignment of block sections (904-0 to 904-6) may take any other form according to application. Most notably, same data sets need not occupy opposing block sections.

A third alternate embodiment may advantageously eliminate the need for search key multiplexers. Further, unlike the arrangement of FIG. 1, only one key value from a selectable group need be applied to a given block section, eliminating the need to provide three different buses (e.g., for keyFIB<0>, keyFIB<1> and keyACL<0>) to each block section.

Figure 10:
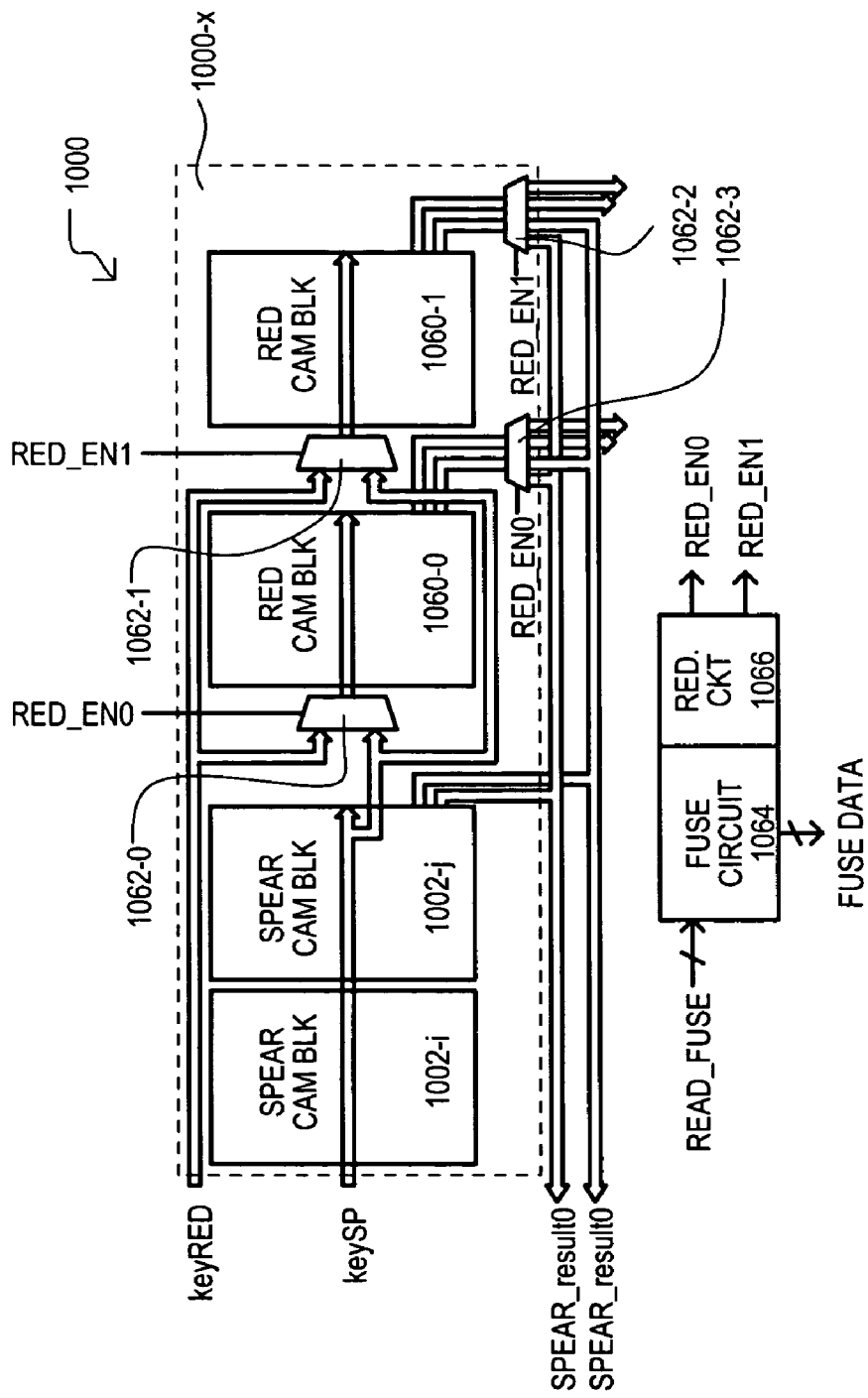
FIG. 10 is a block schematic diagram of a CAM device according to a fourth alternate embodiment of the present invention.

A CAM device according to a fourth alternate embodiment is set forth in FIG. 10, and designated by the general reference character 1000. FIG. 10 shows one example of a block section 1000-x of a CAM device. A CAM device can otherwise take the form of that in FIG. 1 or FIGS. 7-9.

A block section 1000-x can include two CAM blocks 1002-i and 1002-j that serve as a SPEAR CAM. Remaining CAM blocks 1060-0 and 1060-1 are "redundant" CAM blocks. As is well understood by those skilled in the art, redundant CAM blocks can be "extra" CAM blocks employed to replace defective CAM blocks. In a fourth alternate embodiment, in the event such redundant CAM blocks are not needed for repair, such CAM blocks can be utilized to increase the capacity of a SPEAR CAM.

More particularly, each redundant CAM block (1060-0 and 1060-1) can include redundancy MUXs 1062-0 to 1062-3 controlled according to different redundancy enable signals RED_EN0 and RED_EN1. If a redundant CAM block (1060-0 and 1060-1) is available (not needed for replacement), the corresponding redundancy enable signal can allow a SPEAR search key to be applied to the redundant CAM blocks (1060-0 and 1060-1) and provide proper routing for SPEAR search results.

FIG. 10 also shows a fuse circuit 1064 and redundancy control circuit 1066. As is well understood by those skilled in the art, in a repair operation, replacement of defective CAM blocks can be enabled by fuse-type structures (i.e., some structure retaining data in a nonvolatile fashion). Such fuses can be set (e.g., "blown") to enable redundancy. As shown in FIG. 10, in the alternate embodiment, a fuse circuit 1064 can be read to determine which redundant CAM blocks are available, if any. According to such data, a system can identify those redundant CAM entry locations as available to store SPEAR CAM entry data.

In this way, redundant CAM blocks can be utilized to enhance the capacity of a SPEAR CAM.

Having described CAM devices according to various embodiments, various methods according to the present invention will now be described.

Figure 11:
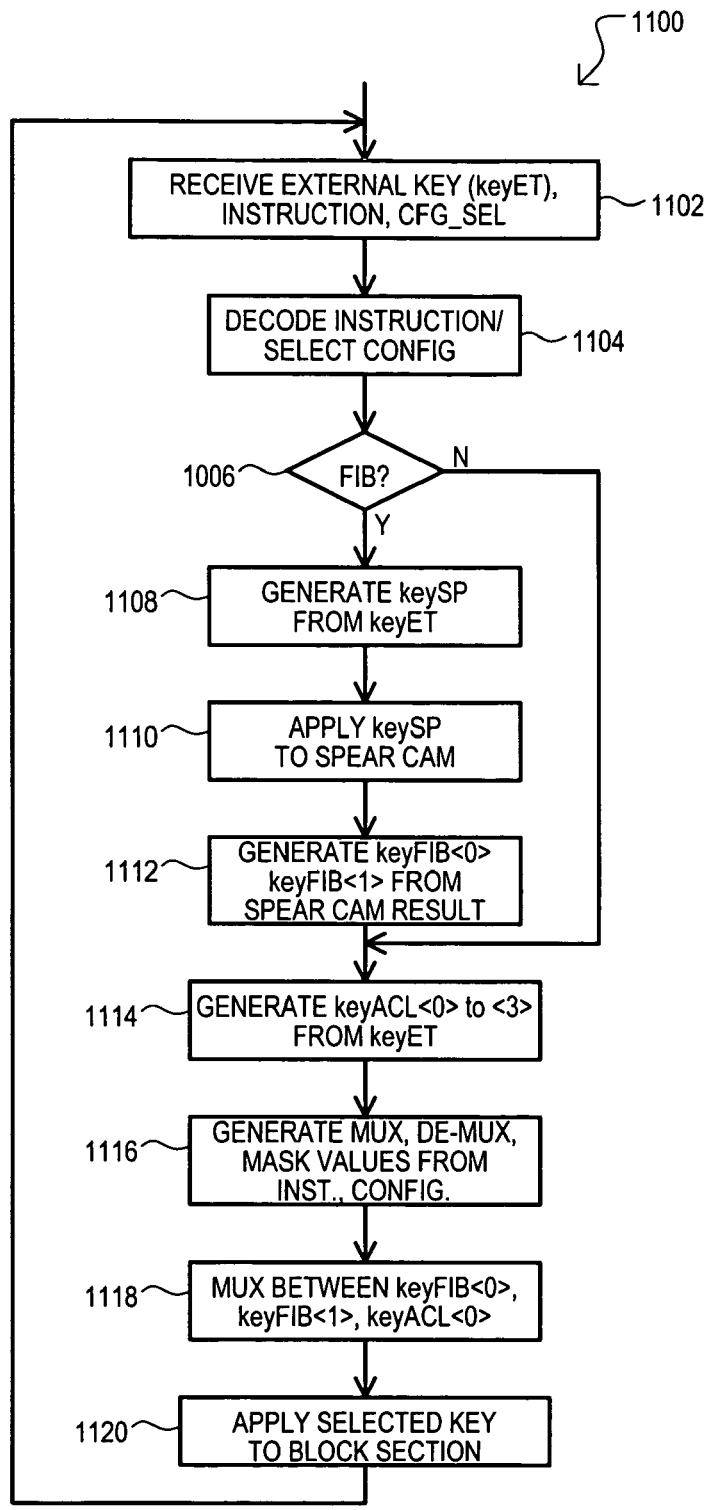
FIG. 11 is a flow diagram showing a method for performing simultaneous and different type searches in a CAM device according to one embodiment of the present invention.

A method for performing simultaneous and different type searches in a CAM device is set forth in a flow diagram in FIG. 11, and designated by the general reference character 1100. Method 1100 will be described with reference to terms and values shown in the embodiment of FIG. 1. However, it is understood that the method represents but one embodiment, and should not be construed as limiting the invention thereto.

A method 1100 can include receiving external search data (step 1102), which in this particular example, can include an external search key keyET, an instruction, and a configuration select value. An instruction can be decoded to determine a particular search type (e.g., SPEAR or non-SPEAR) and a configuration can be selected (step 1104). Selection of a configuration can result in a CAM being configured to provide access to multiple data sets.

A method can then determine if a search involves an algorithmic or non-algorithmic search (e.g., tree or flat) (step 1106). In the very particular example of FIG. 11, this involves determining if a search is to access a forwarding information base (FIB).

In the event an algorithmic search is involved, a method 1100 can include generating an initial search key from external search key data. In the particular example of FIG. 11, this can involve generating a SPEAR search key (keySP) from external search keyET (step 1108). The SPEAR search key (keySP) can then be used to search one portion of a CAM device as a first step of an algorithmic search. Thus, in the method 1100 a search key keySP can be applied to a SPEAR CAM (step 1110).

The initial search of a SPEAR CAM can yield first algorithmic search results. From such search results, one or more second search keys can be generated for application to a different portion of the CAM. This is shown in FIG. 11 with the generation of search keys keyFIB<0> and keyFIB<1> from SPEAR CAM results (step 1112).

Once an initial part of algorithmic search is performed (in this example, steps 1108 to 1012) or if an algorithmic search is not involved, a method can then generate non-SPEAR search keys. In FIG. 11, this can involve generating keys keyACL<0> to keyACL<3> from a keyET (step 1114).

A method 1100 can then generate various values needed to apply different search keys to different portions of a CAM array. In FIG. 11, this includes generating MUX control signals from a supplied instruction and/or selected configuration (step 1116). With the generated MUX signals, a method can selectively choose between different search key values. This is shown by step 1118, which includes MUXing between search keys keyFIB<0>, keyFIB<1> and keyACL<0>.

A method can then apply selected search keys to the corresponding block section (step 1120). This step can involve furthering an algorithmic search with the application of search keys keyFIB<0> or keyFIB<1>, and/or executing a non-algorithmic search in the case of search keys keyACL<0> to keyACL<3>. It is understood that different search keys can be applied to different block section simultaneously.

In this way, a same CAM device method can execute multiple search types essentially simultaneously.

As has been described above, CAM devices and methods according to the various embodiments can accommodate multiple data sets (e.g., tables). In many cases it may be desirable to store such data sets within the same CAM device with a given priority with respect to one another. A method for writing data sets to a CAM device according to a priority is set forth in FIG. 12 and designated by the general reference character 1200.

Figure 12:
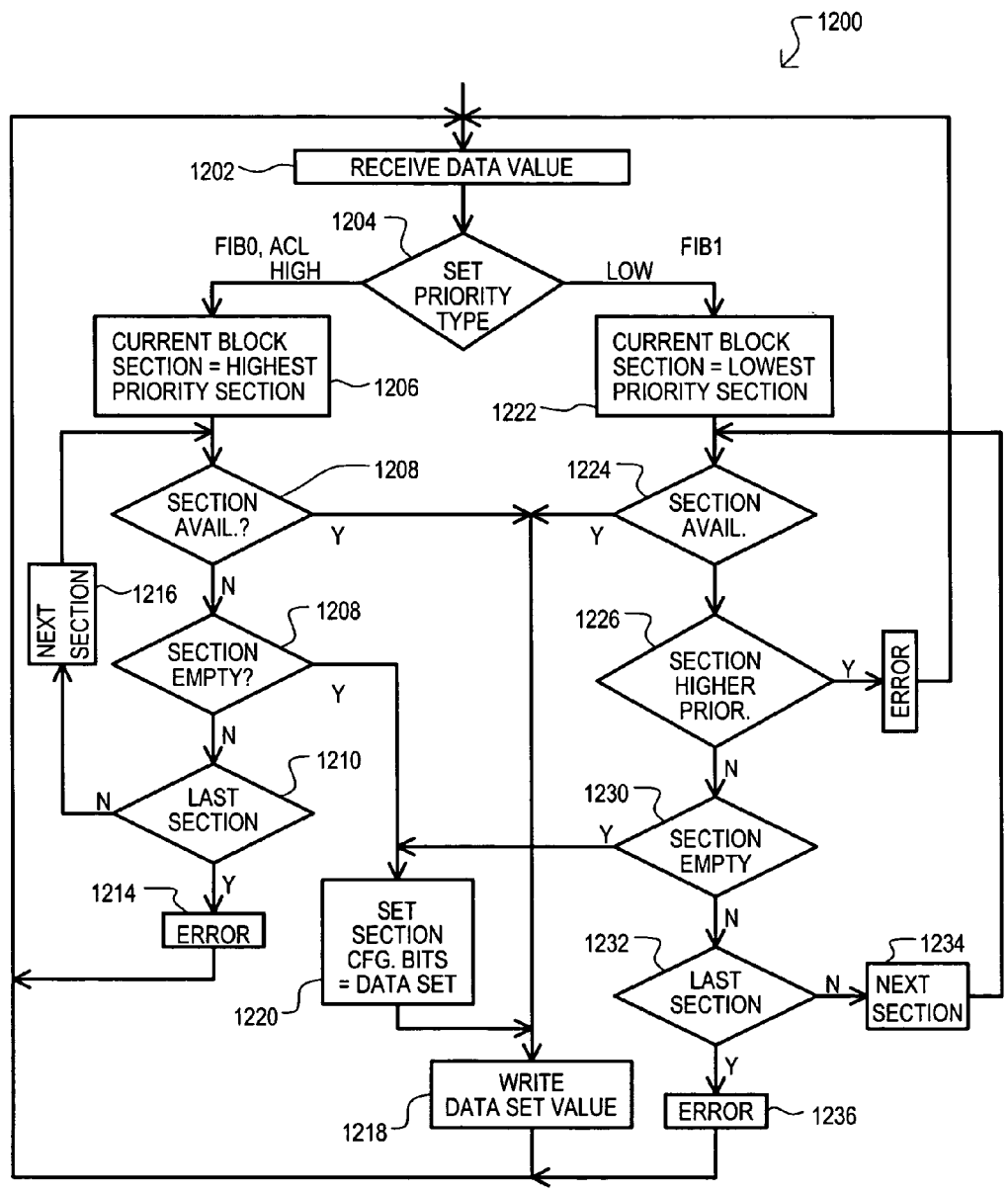
FIG. 12 is a flow diagram of a method for writing data sets to a CAM device according to a priority according to one embodiment.

The method 1200 of FIG. 12 assumes that a CAM device has an inherent priority that exists at least on the block section (e.g., block half-row) level. Further, the method accommodates two priorities. Of course, alternate embodiments could accommodate multiple priority levels.

A method 1200 can begin with the receipt of a data set value (step 1202). Such a step can include receiving a particular data value with some identifier that indicates to which set the data value belongs. For example, in the various embodiments described above a data set value could belong to any of data sets FIB0, FIB1, and ACL0 to ACL3.

A method 1200 can determine a priority from such a set (step 1204). In the very particular example shown, data sets FIB0 and all ACL data sets are given priority over data set FIB1.

In the event a data value belongs to a higher priority data set, a method can begin to examine block sections for possible write operations starting with a highest priority block section (step 1206). A current section can be examined to see if it is available for the data set value (step 1208). Particular examples of how such an availability determination is made will be described in more detail at a later point herein.

If the current section is available, the data set value can be written into the section (step 1218).

If the current section is not available, the section can be examined to determine if it is empty (step 1210). If the section is empty, the configuration bits for the section are set to identify the current data set (step 1220), and the data set value is written into the section (1218).

If the current section is neither available nor empty, a next section can be examined (step 1216) and the steps repeated. If a last section is reached (step 1212), the CAM device can be considered full with respect to the current data set, and an error message can be issued (step 1214).

The above method has assumed that automatic writing over lower priority data set values is not allowed.

In the event a data value belongs to a lower priority data set, a method can begin to examine block sections for possible write operations starting with a lowest priority block section (step 1222). A current section can be examined to see if it is available for the data set value (step 1224). If the current section is available, the data set value can be written into the section (step 1218).

If the current section is not available, the section can be examined to determine if it is a higher priority section (step 1226). If the section is a higher priority section, an error message can be generated (step 1228) to indicate that no section with appropriate priority is available.

As in the case of the higher priority flow, if the current section is not available, the section can be examined to determine if it is empty (step 1230). If the section is empty, the configuration bits for the section are set to identify the current data set (step 1220), and the data set value is written into the section (1218). Further, if the current section is neither available nor empty, a next section can be examined (step 1234) and the steps repeated. If a last section is reached (step 1232), the CAM device can be considered full with respect to the current priority, and an error message can be issued (step 1236).

It is understood that the writing of data set value (step 1218) can include numerous conventional substeps that ensure the data set value is written into a CAM entry having appropriate "inter-section" priority. That is, the data set value is written into a location that has appropriate priority with respect to other data set values of the same section.

As noted in the above method shown in FIG. 12, a section can be examined to determine if it is available for a write operation (e.g., steps 1208 or 1224). One very particular example of how such a step is executed is shown in FIG. 13.

Figure 13:
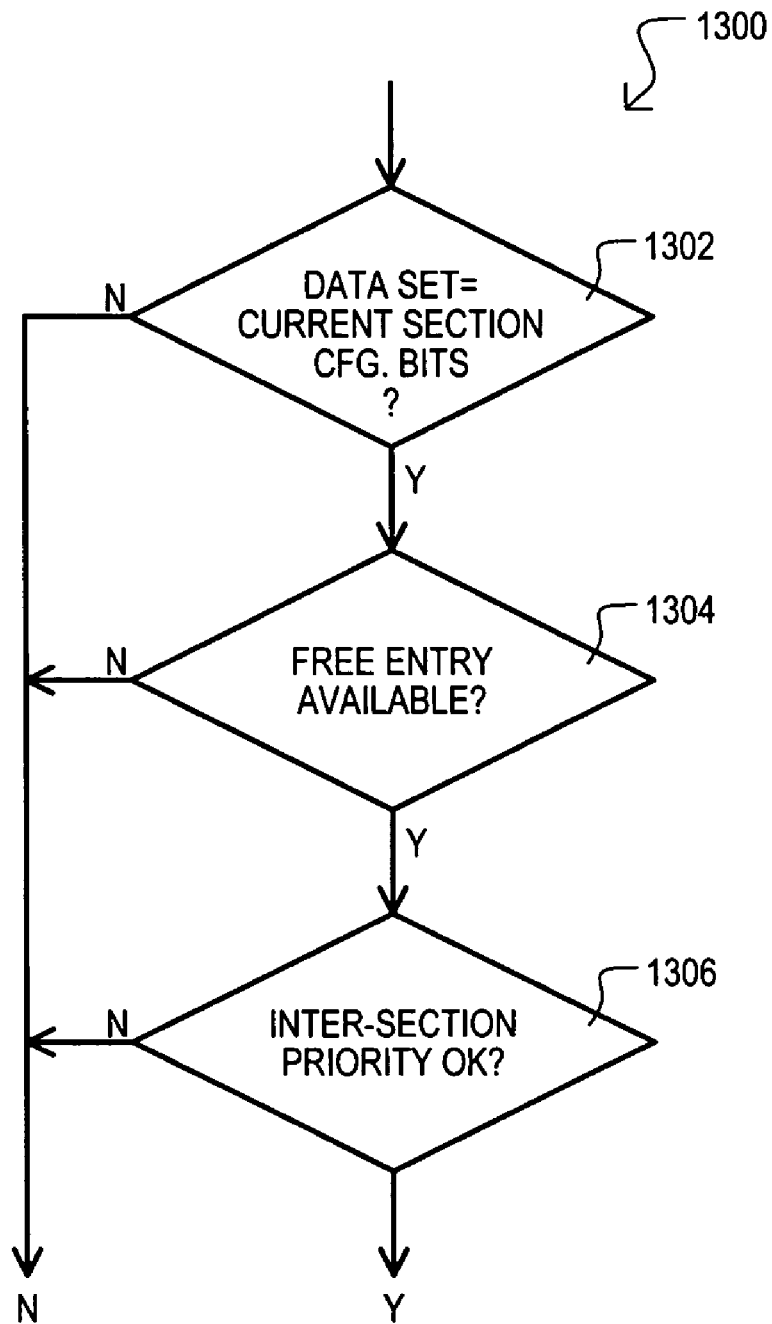
FIG. 13 is a flow diagram of a step for determining if an entry is available for a write, for use the method of FIG. 12.

FIG. 13 is a flow diagram of a method for examining a section (e.g., CAM block half-row) for availability 1300. The method 1300 can include checking to see if the data set of the received value matches the section configuration bits (step 1302). If no match occurs, the section is either designated for a different data set, or is empty (not yet assigned). If a match does occur, the section will be examined to see if a free entry is available (step 1304). In one very particular example, such a step can include checking status bits associated with the CAM blocks of the section.

If a section matches, and one or more entries is available, the method 1300 can further include checking to see if any of the available entries has appropriate priority (step 1306). If an entry with appropriate inter-section priority is available, the section can be considered available.

Of course, the above methods are but very particular embodiments of the present invention, and should not be construed as limiting the invention thereto.

Further, it is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
a plurality of regular CAM blocks each having a plurality of CAM entries for comparing stored data values with corresponding internal search key values;
at least one algorithmic search CAM block for storing data set values that generate match results corresponding at least a first search data set in response to at least a portion of an external search key data value; and
an overlay engine that, in an overlay mode, generates an overlay search key in response to a match result from the at least one algorithmic search CAM block, and applies the overlay search key to at least one regular CAM block, and in a non-overlay mode, generates at least one non-overlay search key from an external search key data value without accessing the algorithmic search CAM block, and applies the non-overlay search key to at least one regular CAM block storing data set values of a second data set.

2. The CAM device of claim 1, wherein:
the at least one regular CAM block stores at least a portion of a forwarding information base (FIB).

3. The CAM device of claim 1, wherein:
in the non-overlay mode, the overlay generates at least one non-overlay search key from an external search key data value without accessing the algorithmic search CAM block, and applies the non-overlay search key to the algorithmic search CAM block.

4. The CAM device of claim 1, wherein:
the second data set comprises at least one access control list (ACL).

5. The CAM device of claim 1, wherein:
the CAM device comprises an array of N×M block areas, where N and M are integers greater than one, at least one algorithmic search CAM block occupying at least one circuit block area, a majority of the remaining circuit block areas containing one of the regular CAM blocks.

6. The CAM device of claim 5, wherein:
the overlay engine occupies at least one of the circuit block areas.

7. The CAM device of claim 6, wherein:
the at least one circuit block area containing the at least one algorithmic search CAM block is adjacent to the at least one circuit block area containing the overlay engine.

8. The CAM device of claim 1, wherein:
the CAM device comprises an array of N×M block areas, where N and M are integers greater than one; and
the overlay engine occupies a space outside of the N×M block areas.

9. The CAM device of claim 1, wherein:
the overlay engine further comprises an algorithmic search random access memory for receiving index values from the algorithmic search CAM block and generating overlay search keys therefrom.

10. The CAM device of claim 1, wherein:
the overlay engine further includes a decoder for decoding a portion of an external search key value to establish the overlay mode.

11. A content addressable memory (CAM) device, comprising:

a plurality of regular CAM blocks each having a plurality of CAM entries for comparing stored data values with corresponding internal search key values;

at least one algorithmic search CAM block for storing data set values that generate match results corresponding to at least a first search data set in response to at least a portion of an external search key data value;

an overlay engine that, in an overlay mode; generates an overlay search key in response to a match result from the at least one algorithmic search CAM block, and applies the overlay search key to at least one regular CAM block, and in a predetermined mode, generates at least one non-overlay search key from an external search key data value without accessing the algorithmic search CAM block, and applies the non-overlay search key to at least one regular CAM block storing data set values of a second data set different from the first data set;

the CAM blocks are organized into block sections to which data set search key values are commonly applied;

a mode selector that determines which regular CAM block receives which search key according to configuration selection bits; and a selector multiplexer (MUX) corresponding to each block section, each selector MUX having at least one input for receiving an overlay search key and at least one input for receiving a non-overlay search key, and a MUX output coupled to the corresponding block section.

12. The CAM device of claim 11, wherein:
the overlay search key and non-overlay search key are provided to the block sections by search key wiring; and
each selector MUX is formed below the search key wiring.

13. The CAM device of claim 11, further including:
a configuration store having a plurality of configuration storage locations, each configuration storage location storing a set of configuration bits for defining search characteristics for the block sections, each configuration storage location being selectable by at least a portion of the external search key data.

14. The CAM device of claim 13, wherein:
the search characteristics defined by each set of configuration bits are selected from the group consisting of: how portions of the external search key are applied to the block section, which data sets are searched in the block section, and which data sets can be searched simultaneously in the block section.

15. The CAM device of claim 11, wherein:
each block section provides compare results to one of a plurality of compare result buses.

16. A method for performing multiple data sets search types on the same content addressable memory (CAM) device, comprising the steps of:

providing a plurality CAM entries arranged into entry groups for selectively storing data values for one of a plurality of data sets;

in an overlay mode, searching an overlay mode portion of the CAM entries according to at least a portion of an external search key value to generate an overlay data set search key, and searching selected non-overlay mode portions of the CAM entries with the overlay data set search key;

in a non-overlay mode, generating non-overlay data set search keys from the external search key value without accessing the overlay mode portion of the CAM entries, and searching selected non-overlay mode portions of the CAM entries with the non-overlay data set search key; and the non-overlay mode portion of the CAM entries are arranged into a plurality of CAM blocks, each comprising a plurality of CAM entries, the CAM blocks being organized into block sections, the CAM blocks of each block section commonly receiving the overlay data set search key in the overlay mode and the non-overlay data set search key in the non-overlay mode.

17. The method of claim 16, wherein:
the overlay data set search key comprises at least a portion of the external search key value.

18. The method of claim 16, wherein:
the overlay mode also includes, according to predetermined external search key data,
generating non-overlay data set search keys from the external search key value without accessing the overlay mode portion of the CAM entries, and
searching at least a first set of the CAM entries with the overlay data set search key and searching at least a second set of the CAM entries with the non-overlay data set search key, essentially simultaneously.

19. The method of claim 16, wherein:
the plurality of data sets comprises at least one forwarding information base and at least one access control list.

20. The method of claim 16, wherein:
the overlay mode includes multiplexing one of a plurality of data set search keys to a corresponding entry group, the data set search keys including overlay data set search key for application to a corresponding entry group.

21. The method of claim 16, wherein:
the non-overlay mode portion of the CAM entries are arranged into block sections, and
the method further includes a write operation, comprising
receiving a data set value, and
writing the data set value to block section if configuration bits for the entry group correspond to the block section.

22. The method of claim 16, wherein:
the block sections have a priority with respect to one another,
the data set values include at least a first data set and a second data set, the first data set value having a higher priority than the second data set value, and
writing the data set values includes
writing data set values of the first data set to block sections of higher priority than block sections containing data values of the second data set.

23. The method of claim 16, wherein:
the CAM blocks include a plurality of regular CAM blocks and at least one redundant CAM block for replacing a defective regular CAM block, and if a redundant CAM block is available, assigning such a redundant CAM block as at least a portion of the overlay mode portion of the CAM entries.

* * * * *